United States Patent [19]

Murari et al.

[11] Patent Number: 4,821,136
[45] Date of Patent: Apr. 11, 1989

[54] POWER TRANSISTOR WITH SELF-PROTECTION AGAINST DIRECT SECONDARY BREAKDOWN

[75] Inventors: Bruno Murari, Monza; Flavio Villa, Milan, both of Italy

[73] Assignee: SGS Microelettronica S.p.A., Catania, Italy

[21] Appl. No.: 99,356

[22] Filed: Sep. 21, 1987

[30] Foreign Application Priority Data

Sep. 30, 1986 [IT] Italy ............................... 21855 A/86

[51] Int. Cl.$^4$ .............................................. H02H 9/02
[52] U.S. Cl. .......................................... 361/58; 361/91
[58] Field of Search ................... 361/54, 56, 58, 91, 361/101, 100, 98, 18; 330/298, 207 P; 302/130; 340/662-660

[56] References Cited

U.S. PATENT DOCUMENTS 3,924,158 12/1978 Farnsworth .................. 361/98 X

Primary Examiner—Todd E. DeBoer
Attorney, Agent, or Firm—Guido Modiano; Albert Josif

[57] ABSTRACT

A power transistor with self-protection against direct secondary breakdown comprises a plurality of elementary transistors having their emitter terminals mutually connected and forming a common emitter terminal, collector terminals also mutually connected and forming a common collector terminal, and base terminals connected to at least one current source. Switches are furthermore provided selectively associated with some of the elementary transistors, preferably with one elementary transistor every two, and allowing operation of the associated elementary transistors in the saturation operating region and switching off the associated elementary transistors during high-voltage operation.

10 Claims, 1 Drawing Sheet

POWER TRANSISTOR WITH SELF-PROTECTION AGAINST DIRECT SECONDARY BREAKDOWN

BACKGROUND OF THE INVENTION

The present invention relates to a power transistor with self-protection against direct secondary breakdown.

As is known, direct secondary breakdown is the main cause of malfunction in power transistors and occurs due to a concentration of current in a specific region so that the local temperature increase has a regenerative effect on the accumulation of current in said region and represents a positive feedback phenomenon.

It is furthermore known that the main impediment to the obtainment of an improved direct secondary breakdown phenomena withstanding ability of power transistors is due to the electrothermic interaction among the different power dissipating regions of the transistor.

In order to improve the ability of transistors to withstand to such stresses, several solutions have already been proposed. In particular, one solution entails the use of resistors, so-called ballast resistors, in series to the emitter of each elementary transistor constituting the complete power transistor. Another solution is proposed in the U.K. Pat. No. 1,467,612, disclosing replacing each elementary transistor with a pair of transistors geometrically arranged so as to obtain a compensation of the thermal imbalances. Yet another solution is the one known from the Italian patent application No. 21028 A/84, in the name of the assignee of the present application, according to which each elementary transistor is controlled by means of its own current source so as to reduce electrothermic regeneration phenomena.

Such known solutions allow to reduce only partly the phenomenon of direct secondary breakdown and are not always free from disadvantages.

A substantial improvement in the problem is instead achieved according to the solution indicated in the U.S. Pat. No. 4,682,197, assigned to the same assignee of the present application. According to the solution described in the abovementioned patent, it is possible to obtain an integrated semiconductor device capable of delivering a power which is equal to the sum of the powers supplied by each elementary transistor (formed by a plurality of cells and indicated also as a "finger", the latter including a group of cells) if a bipolar power transistor is produced. In detail, the device consists of a plurality of elementary transistors electrically connected but physically spaced apart by an amount equal to 17 mils (i.e. approximately the width of a single finger).

Since however in most cases the maximum number of fingers constituting the power transistor is set by the saturation voltage, the solution indicated in the last-mentioned patent does not constitute a fully optimum solution as to the bulk of said power transistor. Moreover, the solutions indicated in order to minimize the bulk of the device, such as the insertion, between two adjacent elementary transistors, of the drive transistors operating as current sources or of the elementary transistors of the complementary stage, if the device constitutes a class-B output stage the two output transistors whereof operate alternately, are limited in their usefulness, in particular when the double metal level cannot be used.

SUMMARY OF THE INVENTION

Given this situation, the aim of the present invention is to provide a bipolar power transistor which eliminates the disadvantages of the prior art solutions and in particular provides a behavior which is improved and self-protecting against direct secondary breakdown phenomena.

Within this aim, a particular object of the present invention is to provide a bipolar power device the elementary transistors whereof are adjacent to one another, without interspacing, and which is nonetheless capable of ensuring the same power levels obtainable with the spaced structure indicated in the last-mentioned patent.

Still another object of the present invention is to provide a bipolar power transistor which has low saturation values by virtue of the fact that during its operation in saturation all the elementary transistors, or fingers, are active.

Another object of the present invention is to provide a bipolar power transistor having a bulk practically equal to the one of a standard structure.

Not least object of the present invention is to provide a power transistor which can be easily integrated using technology and machinery which is common in the electronics industry, so as to have production costs which are comparable with known devices.

The aim described, the objects mentioned and others which will become apparent hereinafter, are achieved by a power transistor self-protecting against direct secondary breakdown, as defined in the appended claims.

According to the invention, during operation in low-current saturation, in which there is no risk of direct secondary breakdown, all the elementary transistors work together so as to exploit to the utmost the silicon area, while instead, proximate to the region in which direct secondary breakdown may occur, some transistors, preferably arranged alternated with the remaining elementary transistors, are suddenly or gradually switched off so that the elementary transistors not controlled by the switches, when they operate in the high-voltage operation region, are mutually spaced like in the solution indicated in the U.S. Pat. No. 4,682,197.

In this manner, in the dangerous operation region, the power deliverable by an individual elementary transistor is multiplicated by tne number of elementary transistors not switched off by the related switch.

BRIEF DESCRIPTION OF THE DRAWINGS

Further features and advantages of the invention will become apparent from the description of two preferred, but not exclusive, embodiments, illustrated only by way of non-limitative example in the accompanying drawings, wherein.

DESCRIPTION OF THE PREFERRED EMBODIMENTS

Figure 1:
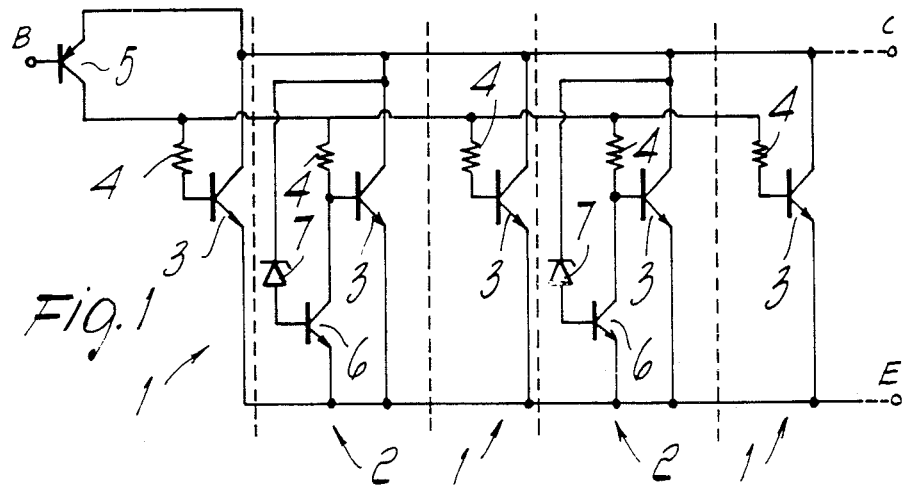
FIG. 1 is the equivalent circuit diagram of a first embodiment of the power transistor according to the invention.

With reference to FIG. 1, a first embodiment of the power transistor is illustrated in which some individual elementary transistors which form the complete power transistor are switched off suddenly when a specific threshold voltage is exceeded.

In FIG. 1 the power transistor comprises a plurality of transistor structures, separated from one another by broken lines and respectively indicated by the reference numeral 1 if they are not provided with switch means, and by the reference numeral 2 when they comprise a control switch for turning off the associated elementary transistor when a threshold voltage is exceeded. In detail, each transistor structure 1, 2 comprises an elementary transistor 3, here of the NPN type, said elementary transistors 3 having mutually connected emitter terminals which form the common emitter terminal of the device, indicated at E, collector termnals also are mutually connected and forming the common collector terminal C of the power transistor, and base terminals each connected to a respective resistor 4. In the illustrated embodiment, the elementary transistors are driven by a common current source, formed here by a transistor 5 of the PNP type having its base terminal forming the base terminal B of the complete power transistor, its collector terminal connected to the resistors 4 and its emitter terminal connected to the common collector terminal C of the device.

As is apparent, the structure consists of the alternation of transistor structures 1 and 2 having the basic structure described above and being differentiated in that the transistor structures indicated at 2 have switch means adapted to cause their switching off when a preset threshold voltage is reached. In particular, here, the switch means consist of the combination of a transistor 6 connected to the base of the transistor 3 and of a Zener diode 7 appropriately connected between the base of the transistor 6 and the common collector terminal C. In detail, the transistor 6 is an NPN transistor having its collector terminal connected to the base of the transistor 3, its emitter terminal connected to the common emitter terminal E, and its base terminal connected to the anode of the Zener diode 7, having its cathode connected to the common collector C.

As is clear to the expert in the field, during low-voltage operation all the elementary transistors 3 are operating, since across the Zener diodes 7 there is a reverse voltage having a value insufficient to cause them to conduct. On the contrary, when the breakdown voltage of the Zener diodes 7 is exceeded, said diodes start to conduct, switching on the respective transistors 6 which therefore, shorting the emitter and base terminals of the transistors 3 associated therewith, cause their switching off. Accordingly, if the power transistor operates in the danger zone in which direct secondary breakdown phenomena may occur, the power transistor according to FIG. 1 has alternately on and off elementary transistors, i.e. in this danger zone the operating elementary transistors are spaced from one another by the space occupied by the off transistors of the structures 2. In this manner it is possible to operate in this region with a structure similar to that proposed in the aforesaid US patent, which allowed an increase in the power which can be dissipated by said power transistor by a factor equal to the number of operating elementary transistors.

The solution illustrated in FIG. 1 is particularly simple and allows the immediate switching off of the transistors having the switching-off system when the voltage threshold present by the zener 7 is reached. However, if the power transistor operates in a linear manner, such a sudden switching off is undesirable since it would entail distortions in the output signal which may be disadvantageous, for example, if the power device is used in audio devices or in other systems in which a switching operation is desired. In this case it is possible to use instead the solution illustrated in FIG. 2, wherein the switch means no longer operate so as to suddenly switch off the associated elementary transistors, but, upon exceeding the preset threshold voltage, switch off said transistors gradually. In detail, the power transistor according to FIG. 2 also consists of the alternation of transistor structures, here indicated at 10 and 11 depending respectively on whether the associated elementary transistor is active in high-voltage operation or is switched off in said region. Each transistor structure 10, 11 substantially consists of an elementary transistor 16, here of the NPN type, and of a related drive transistor 15, here of the PNP type. In detail, the transistors 16 have mutually connected collector terminals forming the common collector terminal C of the device, first mutually connected power emitter terminals 17 forming the common emitter terminal E of the device, and base terminals connected to the collector terminals of the drive transistors 15. In turn, the drive transistors 15 have emitter terminals which are connected to one another and to the common collector terminal C of the device and base terminals connected to one another and forming the common base terminal B of the device. According to the illustrated embodiment, each elementary transistor is provided with a current control system which comprises a second emitter 18 having an appropriate area and being insulated from power emitter 17 and a further transistor respectively indicated at 19 and 19' depending on whether it belongs to the transistor structure 10 and 11. As can be seen in the figure, the transistors 19, 19' are connected with their collector terminal to the base of the transistors 16 and with their base terminal to the second emitter 18 of the transistor 16. The emitter terminal of the transistors 19 and the main emitter terminal 21 of the transistors 19' are connected, to the common emitter terminal of the complete power transistor, while the transistors 19' of the transistor structures 11, provided with the switching-off system, have a second emitter 22 connected to the common collector terminal C through a related resistor 23. The current limiting structure is completed by a resistor 20 arranged between the second emitter 18 of the transistor 16 and the common emitter terminal E, with an anti-leakage function so as to better define the existing current levels.

Figure 3:
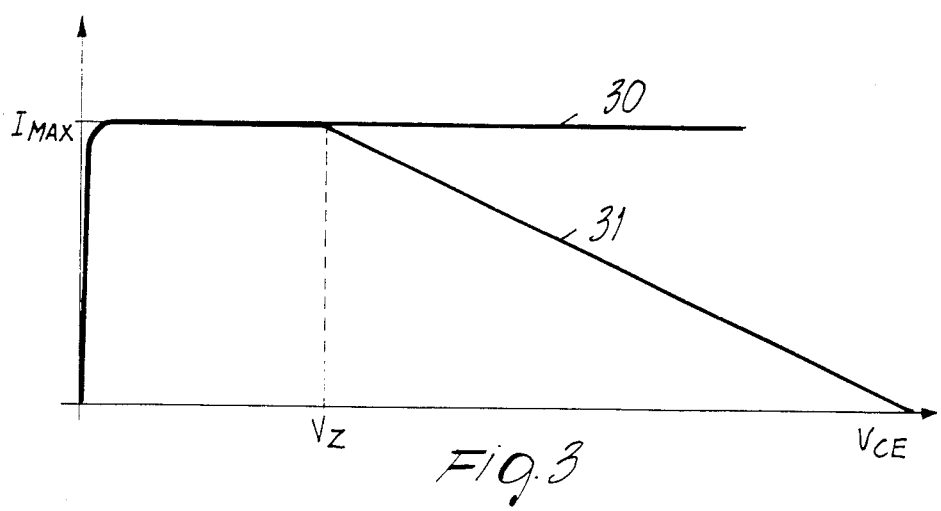
FIG. 3 illustrates the behavior of the currents flowing in the individual elementary transistors of the embodiment according to FIG. 2 versus the collector to emitter voltage.

By virtue of the structure illustrated in figue 2 the currents supplied by the individual transistors 16 are as illustrated in FIG. 3, wherein 30 indicates the current supplied by transistor structures 10, while 31 indicates the current supplied by the transistor structures 11. In practice, by virtue of the provision of the second emitter 18, having an appropriate area, smaller than that of the main or power emitter 17 and being insulated from the latter, preferably arranged at the center thereof, but even laterally thereto, a system is obtained which detects the base-emitter voltage drop and the temperature of the power transistor and is capable, together with the transistor 19, to limit said drop to the sum of the base-emitter drop of the transistor 19 and the base-emitter 18 of transistor 16 in the forward active region. Moreover, by virtue of the second emitter 18 and of the transistor 19 it is also possible to limit the overall current flowing in the power transistor. In fact the emitters 18 and 22 are dimensioned as to obtain desired current ratios, achieving limitation of the total current of the transistor structure, and therefore the output characteristic indicated by 30 in FIG. 3.

Instead, as to the transistor structure indicated at 11, since the second emitter 22 of the transistor 19' acts like a zener diode, in the low-voltage operating region with the zener in the OFF state, the structure 11 operates exactly like the one of FIG. 10 and the current output characteristic 31 coincides with the first part of the curve 30 in FIG. 3. However, when the voltage between the collector and the emitter of the power transistor increases so much as to cause the breakdown of the Zener diode formed by the junction base-second emitter 22, the Zener starts to conduct, drawing current through the resistor 23. The beginning of the conduction of the transistor comprising the second emitter region 22 causes a removal of current from the base of the transistor 16 which gradualy begins to switch off. As the voltage between the comon collector C and the emitter E increases, a progressive switching off of the transistor 16 therefore occurs along the descending line indicated by 31 in FIG. 3. In particular, the point at which the curve 31 reaches zero depends on the ratio between the resistors 20 and 23.

Figure 2:
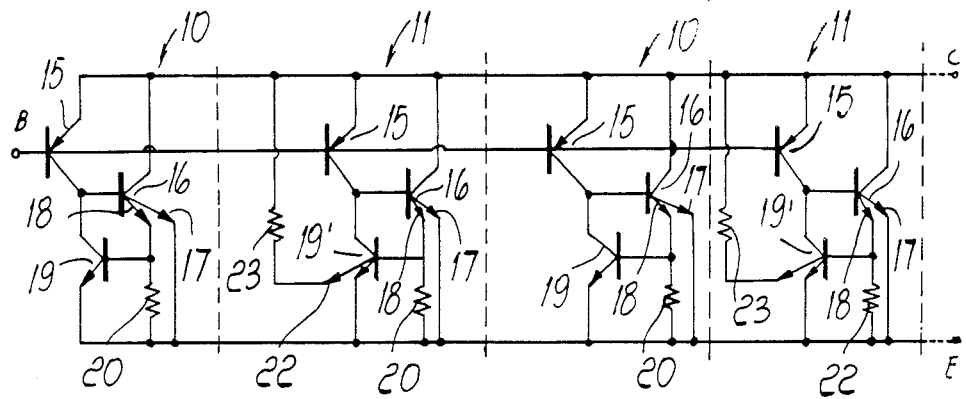
FIG. 2 is an equivalent circuit diagram of the second embodiment of the power transistors according to the invention.

In practice, with the structure according to FIG. 2 a device is provided which, besides achieving the illustrated current limiting by virtue of the second emitter 18 and the transistor 19, has a system for switching-off the elementary transistors which operates in a gradual manner and is therefore adapted for linear operation. As in the preceding embodiment, the transistor structures 11 with associated switching-off system are preferably arranged alternately to the transistor structues 10 which remain active even in the high-voltage region, so that after the switching off of the transistor structures 11 a system is obtained having active elementary transistors which are mutually spaced apart by an amount equal to the width of one elementary transistor, thus obtaining an improvement in the direct secondary breakdown withstanding ability by virtue of the improvement in the $I_{s/b}$ (i.e., the collector current for which, at a specific collector-emitter voltage, the elementary transistor fails) by a factor equal to the number of active elementary transistors.

As is apparent from the previous description, the invention fully achieves the intended aim and objects. In fact a power transistor has been provided in which an optimum area occupation occurs with low saturation values since in said operating region all the elementary transistors are active, obtaining however an improvement in the direct secondary breakdown withstanding ability by switching off some elementary transistors in case of operation in the danger zone due to the possiblity of the occurrence of direct secondary breakdown phenomena.

Moreover, the described solution does not require a high circuital complexity and the layout is particularly simple in case of the use of a double metallization level. However, the invention may be implemented also with a single metal layer level.

Furthermore, in the case of the use of the structure illustrated in FIG. 2, limitation of the maximum current is achieved also for the elementary transistors which are not provided with the automatic switching-off system, thus improving the characteristics of the device.

The invention thus conceived is susceptible to numerous modifications and variations, all of which are within the scope of the inventive concept. In particular the fact is stressed that though the illustrated embodiments alternate always-active elementary transistors and elementary transistors provided with the switching-off system, so that between two always-active transistors there is always a transistor adapted to switch off in high-voltage operation, said alternation can also be different, for example providing a single elementary transistor having a switching-off device every three elementary transistors or vise versa. Furthermore, though it is advantageous to produce power transistors with an odd number of fingers (elementary transistors), beginning and ending with always active elementary transistors, the invention is nonetheless not restricted to this solution.

Moreover, the sudden or gradual switching-off systems are not limited to the illustrated solutions and the invention comprises any solution which allows switching off of some elementary transistors when the power transistor reaches the region of danger as to direct secondary breakdown.

Furthermore, all the details may be replaced by other technically equivalent ones.

We claim:

1. A power transistor with self-protection against direct secondary breakdown, comprising a first and a second plurality of elementary transistors having their emitter terminals mutually connected and forming a common emitter terminal, collector terminals mutually connected and forming a common collector terminal, and base terminals connected to at least one current source, and switch means selectively connected to said first plurality of elementary transistors for allowing operation of said first plurality of elementary transistor in a saturation operating region and switching off said first plurality of elementary transistors in a high-voltage operating region, while said second plurality of elementary transistors are active in both said saturation and high voltage operation regions, wherein said switch means comprise switching-off transistors having emitter collector terminals connected respectively to said base and emitter terminals of said first plurality of elementary transistors and base terminals connected to said common collector terminal by means of a respective Zener diode.

2. A power transistor according to claim 1, wherein said switch means are of the type switching off said first plurality of elementary transistors suddenly when a preset threshold voltage is reached.

3. A power transistor according to claim 1, wherein each elementary transistor of said first plurality is arranged side-by-side to at least one elementary transistor of said second plurality.

4. A power transistor according to claim 1, comprising an odd number of elementary transistors arranged in sequence side-by-side, said first plurality of elementary transistors with said switch means being provided at even-numbered positions in said sequence of said elementary transistors.

5. A power transistor with self-protection against direct secondary breakdown, comprising a first and a second plurality of elementary transistors having their emitter terminals mutually connected and forming a common emitter terminal, collector terminals mutually connected and forming a common collector terminal, and base terminals connected to at least one current source, and switch means selectively connected to said first plurality of elementary transistors for allowing operation of said first plurality of elementary transistors in a saturation operating region and switching off said first plurality of elementary transistors in a high-voltage operating region, while said second plurality of elementary transistors are active in both said saturation and high voltage operation regions, wherein said switch means comprise a secondary emitter region formed in said first plurality of elementary transistor and switching-off transistors having a base terminal connected to said secondary emitter region, and collector and emitter terminals respectively connected to said base and emitter terminals of said first plurality of elementary transistors, said switching-off transistors further comprising a secondary emitter region connected to said common collector terminal through a respective resistor.

6. A power transistor according to claim 5, wherein a resistor is provided between said secondary emitter region of said first plurality of elementary transistors and a common emitter terminal.

7. A power transistor according to claim 6, wherein said second plurality of elementary transistors is comprising current limiting means including secondary emitter regions formed in a respective one of said elementary transistors and an equal plurality of control transistors, and each of said control transistors having a base terminal connected to a respective one of said secondary emitter regions, a collector region connected to a respective one of said base terminals of said elementary transistors and an emitter terminal connected to said common emitter terminal.

8. A power transistors according to claim 6, wherein said switch means are of the type gradually switching off said first plurality of elementary transistors when a preset threshold voltage is reached.

9. A power transistor according to claim 5, wherein each elementary transistor of said first plurality of arranged side-by-side to at least one elementary transistor of said second plurality.

10. A power transistor according to claim 5, comprising an odd number of elementary transistors arranged in sequence side-by-side, said first plurality of elementary transistors with said switch means being provided at even-numbered positions in said sequence of said elementary transistors.

* * * * *